United States Patent [19]
Schmidt et al.

[11] Patent Number: 4,862,320
[45] Date of Patent: Aug. 29, 1989

[54] RACK FOR CIRCUIT BOARDS OF AN ELECTRICAL SYSTEM

[75] Inventors: William L. Schmidt, Acton; Richard E. Olson, Townsend; Douglas A. Bailey, Concord, all of Mass.

[73] Assignee: Digital Equipment Corporation, Maynard, Mass.

[21] Appl. No.: 198,644

[22] Filed: May 23, 1988

Related U.S. Application Data

[63] Continuation of Ser. No. 97,309, Sep. 14, 1987, abandoned, which is a continuation of Ser. No. 827,387, Jan. 28, 1986, abandoned.

[51] Int. Cl.$^4$ .............................................. H05K 7/20
[52] U.S. Cl. ...................................... 361/383; 211/41; 165/80.3; 439/260; 361/415
[58] Field of Search ............... 211/41, 162; 174/15 R, 174/16 R; 439/59, 64, 68, 76, 79, 260, 267; 62/418; 165/80.3, 104.33; 361/383, 384, 386, 388, 413, 415

[56] References Cited

U.S. PATENT DOCUMENTS

| | | | |
|---|---|---|---|
| 3,301,004 | 1/1967 | Elsing | 62/418 |
| 4,006,388 | 2/1977 | Bartholomew | 361/383 |
| 4,277,815 | 7/1981 | Skrowpa | 361/383 |
| 4,327,835 | 5/1982 | Leger | 361/415 |
| 4,480,884 | 11/1984 | Babuka | 339/176 MP |
| 4,597,173 | 7/1986 | Chino | 339/75 MP |

Primary Examiner—Gerald P. Tolin
Attorney, Agent, or Firm—Nutter, McClennen & Fish

[57] ABSTRACT

The present invention is directed to a structure for positioning electronic modules of an electronic system therein, and particularly to a rack often called a card cage in which circuit boards are disposed. The rack embodying the invention incorporates a frame having four sides and a back plate. Two of the opposite sides are grilles. The frame is adapted for supporting printed circuit boards perpendicular to the grill. Thus, a fluid cooling medium, such as air, can enter the rack through one of the grilles, flow along and between the circuit boards and exit through the other grilles. The resistance to the flow of such air for cooling by the grilles is significantly greater than the boards disposed therein. Thus, the grilles permit a uniform coolant flow for each of the circuit boards in the rack.

The rack has a lever assembly which remotely actuates connectors positioned in the rack to contact the circuit boards positioned therein. The lever assembly is further provided with a spring member which serves as a force-limiting device such that excessive force is not applied to the boards and to the connectors when the boards are inserted into the rack. The rack also has guiding members for guiding warped circuit boards into position within the rack.

14 Claims, 5 Drawing Sheets

RACK FOR CIRCUIT BOARDS OF AN ELECTRICAL SYSTEM

This is a continuation of application Ser. No. 097,309, filed with the U.S. Patent and Trademark Office on Sept. 14, 1987 now abandoned, which was a continuation of Application Ser. No. 827,387, filed with the U.S. Patent and Trademark Office on Jan. 28, 1986.

This invention relates to a supporting structure for printed circuit boards and the like, and more particularly to a rack, often called a "card cage", for electronic systems, that occupies a minimum space, and yet promotes ease of installation, maintenance and replacement of the boards and promotes substantially uniform air flow over said boards.

BACKGROUND OF THE INVENTION

The physical size of electronic systems has been the subject of a substantial development effort for a number of years. The space occupied by such systems has decreased markedly, as a result of a dramatic reduction in the size and power dissipation of the various components that make up the system. In particular, the large-scale integration of the circuitry of such systems has materially reduced the aggregate physical volume of the components of a system.

Even so, the "packaging" of these components in a minimum physical volume remains a challenge to the designers of these systems. As the volume decreases, one encounters increased difficulties and expenses in maintenance and repair due to the limited space and greater concentration of components within such systems. Further, the extraction of internally generated heat becomes more difficult, a significant problem in view of the temperature limits that must be maintained for reliable performance of the various components of such systems.

In general, groups of components which are functionally related are mounted on separate circuit boards. Thus, by choosing among a number of different boards, one may organize a system having the desired set of functional capabilities. The requirements of individual users are varied and a need has developed for "packaging" the circuit boards which permits the inclusion of different combinations of such circuit boards without materially degrading the heat extraction characteristics of the structure.

SUMMARY OF THE INVENTION

It is therefore an object of the invention to provide an improved structure for housing circuit boards of an electronic system in a relatively small physical volume.

Another object is to provide such a structure with improved air flow characteristics which permit substantially uniform cooling flow to the various circuit boards of such systems housed therein.

Another object is to provide such structures with improved air flow characteristics which promote substantially uniform cooling flow to various circuit boards of such systems housed therein when the structures are arranged in parallel.

Another object is to provide an improved structure which promotes substantially uniform cooling flow to various circuit boards of such systems housed therein without being restricted to particular arrangements of such circuitry.

Another object is to provide an improved structure for mounting circuit boards of an electronic system in which the boards of the electronic system can be easily installed, replaced, or repaired.

Still another object is to provide an improved structure having a remote actuator for connecting circuit boards mounted in the structure.

A further object is to provide an improved structure for mounting circuit boards of an electronic system in which warped boards are urged into proper position within the structure.

A rack embodying the invention incorporates a frame having four sides and a back plate. Two of the opposite sides are grilles. The frame is adapted for supporting printed circuit boards perpendicular to the grilles. Thus, a fluid cooling medium, such as air, can enter the rack through one of the grilles, flow along and between the circuit boards and exit through the other grilles. The flow of such air for cooling can be generated in any known manner, such as by the action of a fan. Thus, internally generated heat in various components positioned on the boards can be readily dissipated by the air flow over the components. The grilles are constructed, as set forth below, to promote a uniform coolant flow for each of the circuit boards in the rack.

The rack has a lever assembly which remotely actuates connectors positioned in the rack to contact the circuit boards positioned therein. The lever assembly is further provided with a spring member which serves as a force-limiting device such that excessive force is not applied to the boards and to the connectors when the boards are inserted into the rack. Thus, the rack is adapted so that the boards are installed, replaced, and rearranged easily.

The rack also has guide members for guiding warped circuit boards into position.

The present invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

For a fuller understanding of the nature and objects of the invention, reference should be had to the following detailed description taken in connection with the accompanying drawings in which:

FIG. 1 is a perspective view, from the too, of a rack embodying the invention, constructed to support a set of circuit boards or the like;

FIG. 1b is a side view of the rack of FIG. 1;

FIG. 1c is a front view of the rack of FIG. 1;

FIG. 3a is a sectional view of the grille of FIG. 3 taken along section line 3a;

FIG. 5a is a partial sectional view of the rear panel of FIG. 5 taken along section line 5a;

DETAILED DESCRIPTION OF THE PREFERRED EMBODIMENTS

Figure 1:
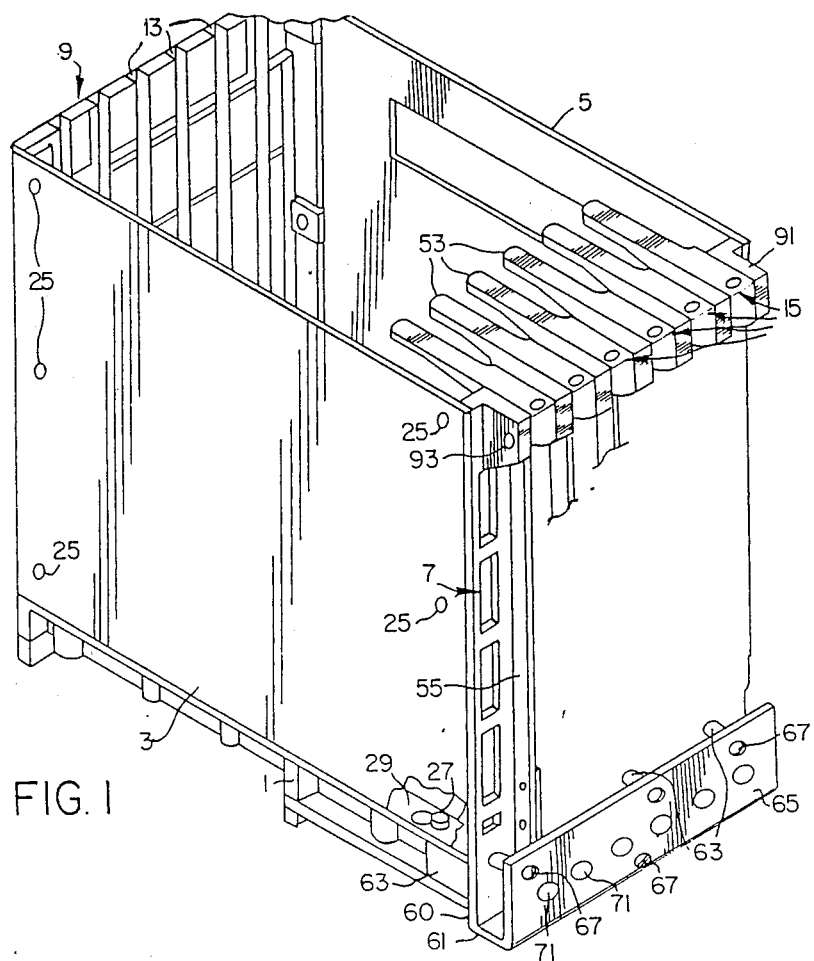
Figure 2:
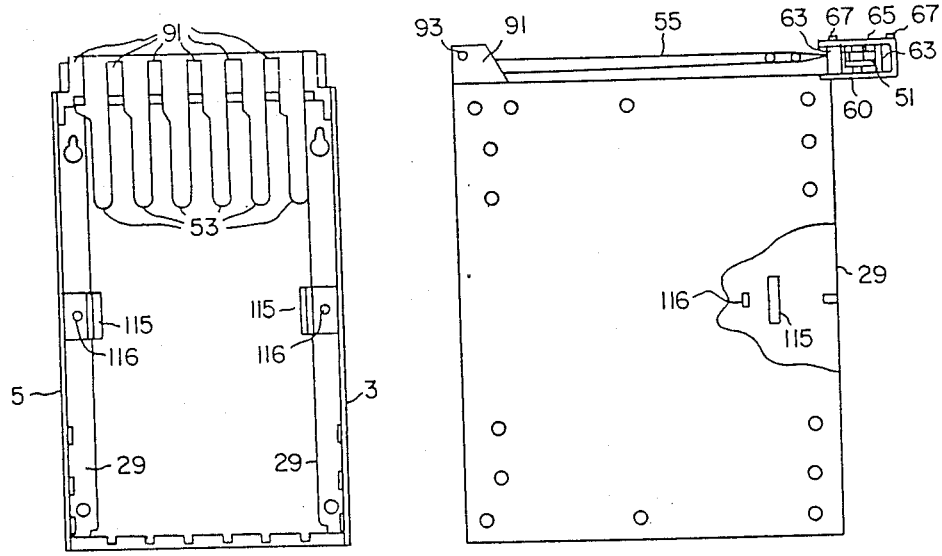
FIG. 2 is a perspective view, from the rear, of the rack of FIG. 1.
Figure 2:
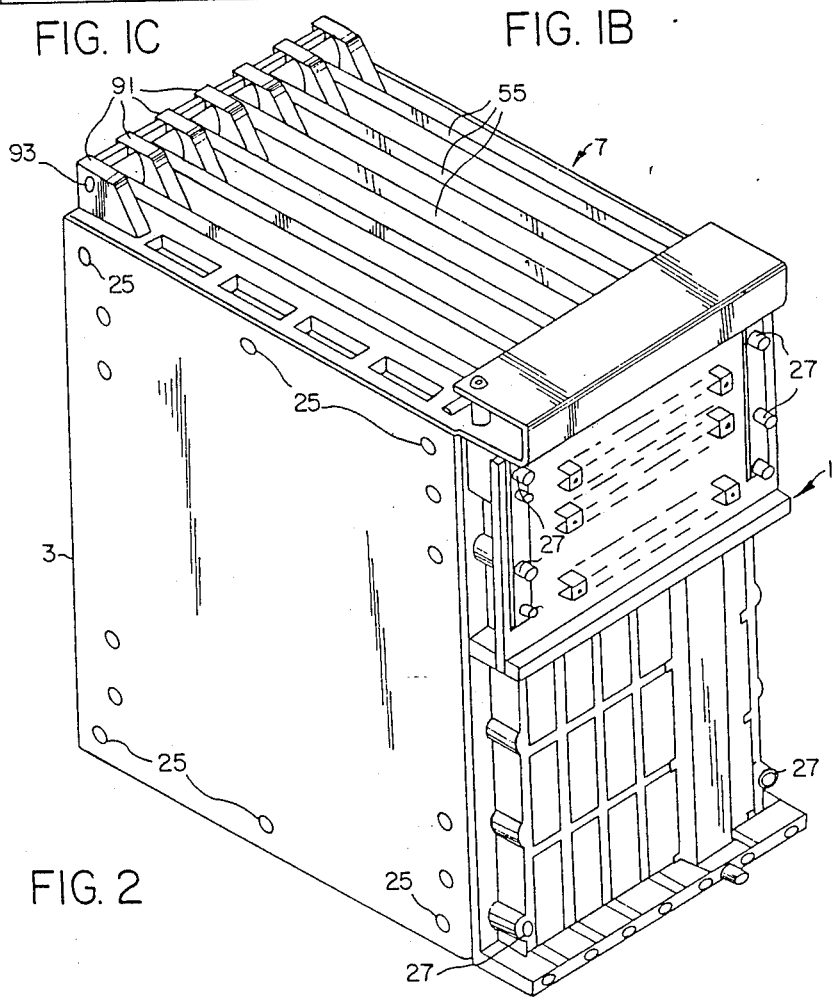

Referring now to FIGS. 1 and 2 a rack for printed circuit boards of an electronic system, such as a data processing system, comprises a back plate 1, left and right side panels 3 and 5, respectively, a top grille 7, and a bottom grille 9.

The grilles 7 and 9 are formed with opposing tracks 11 and 13 (see FIGS. 3 and 4) respectively, which are sized to receive the edges of printed circuit boards (not shown). Lever assemblies 15, secured to the top grille 7, actuate connectors 17 (FIG. 5) positioned in the back panel 1 to contact conductors on the printed circuit boards positioned in the tracks 11 and 13.

Figure 5:
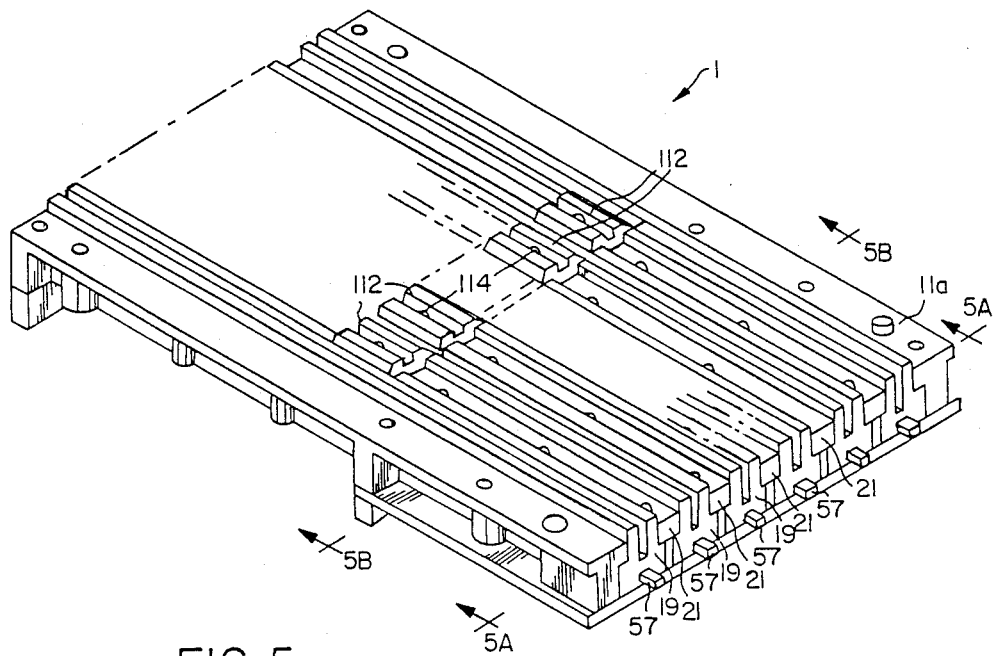
FIG. 5 is a perspective view of a rear panel of the rack.

With reference to FIG. 5, the back plate 1 includes brackets 19 which are mounted thereon by T-shaped bars 21 secured to the back panel 1.

With further reference to FIGS. 1 and 2, the top and bottom grilles 7 and 9 are secured to the side plates 3 and 5 by suitable means such as rivets 25. The back plate 1 is mounted by screws 27 on brackets 29, which extend inwardly from the plates 3 and 5.

Figure 3:
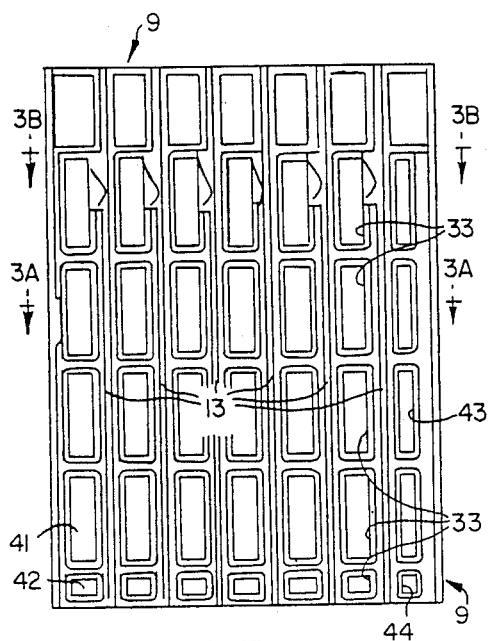
FIG. 3 is a top view of the bottom grille of the rack.
Figure 4:
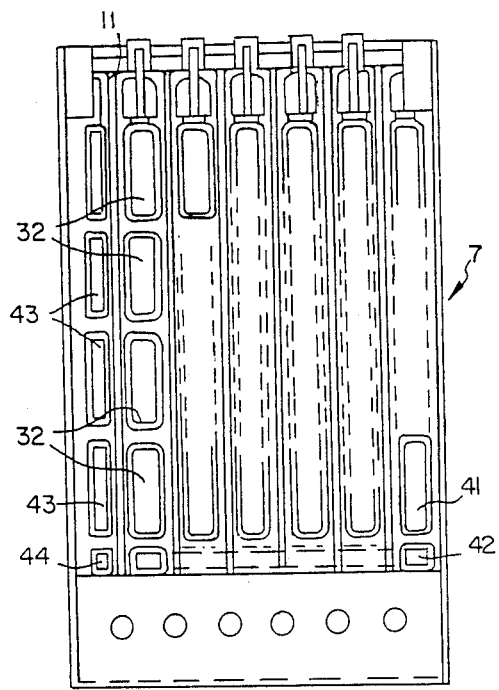
FIG. 4 is a bottom view of the top grille of the rack.
Figure 3A:
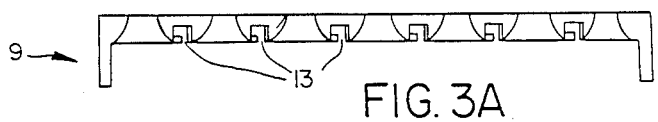
Figure 3B:
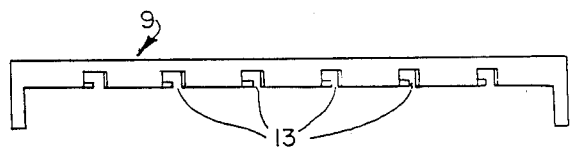
FIG. 3b is a sectional view of the grille of FIG. 3 taken along section line 3b.

Referring now to FIG. 3 and 4, the grilles 7 and 9 are shown with corresponding rows of apertures 32 and 33 (for clarity, only one row of each of the apertures 32 and 33 have been numbered) which are disposed on both sides of each of the tracks 11 and 13, respectively. Thus, air or another cooling medium may be moved through the rack by a blower, fan or other suitable means. The corresponding rows of apertures of the grilles 7 and 9 are sized to have a combined air flow impedance which is substantially greater than the impendance provided by the circuit boards positioned within the rack. Thus, the substitution of different boards in the rack or even the absence of boards therefrom, does not unduly change the air flow through the rows of apertures 32 and 33.

The rack in this instance is sized to receive circuit boards having an approximate height and length of 9 inches and 8 inches, respectively; the illustrated rack is adapted to receive six boards each having a thickness of approximately 3/32 inches. With boards that dissipate up to 50 watts each and with subcomponents extending up to about $\frac{1}{4}$ inch from the surface of any of the boards, Applicants have found that the following dimensions of the apertures 32 and 33 and the spaces between them in the grilles 7 and 9, as shown in FIGS. 3 and 4, are appropriate:

the large sized apertures, such as the apertures at 41, have a length 1¼ inches and a width ⅜ inches;

the smaller sized apertures, such as the apertures at 42, have a length ¼ inches and a width ⅜ inches;

the half-sized large apertures, such as the apertures at 43, have a length 1¼ inches and a width 3/16 inches;

the half-sized smaller apertures, denoted at 44, have a length ¼ inch and a width 3/16 inches;

the solid portions of the grilles 7 and 9, disposed between each of the rows 32 and 33, have a width 13/32 inches; and the solid portions of the grilles 7 and 9, disposed between the apertures in each of the rows 32 and 33, have a length ¼ inch.

Each of the apertures is further provided with contoured sides forming a vena contracta for air entering the aperture and a nozzle for air exiting the aperture. Thus, uniform air flow, without appreciable turbulence generated thereby, enters through the apertures 32, in this case, and passes by any circuit boards positioned in the tracks 11 and 13 adjacent thereto to exit through apertures 33.

Thus, it will be appreciated by those skilled in the art that the above described rack has wide applications to systems using circuit boards and having a forced-flow cooling system in either direction, because the arrangement of grilles 7 and 9 is for flow analysis identical in both directions. The system also permits the rearrangement of boards within the rack without regard for cooling consequences, since the air flow along the boards remains substantially unchanged with respect to the presence, absence or arrangement of other boards within the rack. Applicants have found with the above described example that the maximum variation in flow is on the order of 35% change between a row 32 and 33 having no circuit boards disposed in the adjacent tracks 11 and 13 and a row having boards disposed in both sets of adjacent tracks 11 and 13.

Moreover, series of these racks may be used in parallel arrangements without concern as to the various arrangements of module a within particular rack; and the arrangements of the modules between the parallelly arranged racks, since the impedances are not significantly different between such racks.

With reference now to FIGS. 1a, 1b, 1c, 6 and 6A, crank arms 51 which are connected to levers 53 by links 55. The crank arms 51 are also connected to said connectors 17 by keyed shafts 57 (FIG. 5) which extend from said back plate 1.

Rotation of the shafts 57 moves the connectors 17 from a first position in contact with circuit boards positioned in the bracket 19 associated with the connector 17 to a second position away from the board. Thus, the movement of the levers 53 from the closed position shown in FIG. 1c to the open position away from the rack, as shown by one of the levers 53 in FIG. 1a, causes the links 55 to urge the rotation of the keyed shafts 57 and, therefore, the movement of the connectors 17 from their first to second positions.

As shown in FIG. 1, the top grille 7 has a rearward extension 60 that extends over said back plate 1 and an upwardly extending portion 61 at the outer edge of the extension 60. Centrally threaded cylindrical posts 63 extend from the rearward extension 60. A cover plate 65 is supported on the posts 63 by screws 67.

Figure 6:
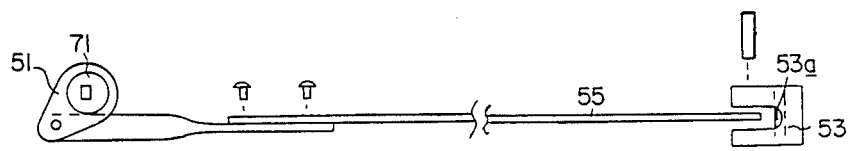
FIG. 6 is a partly exploded top view of an actuator assembly component of the rack.

With reference to FIGS. 1a, 1b, 6 and 6A, a set of actuator shafts 71 are disposed for rotation in holes in the cover plate 65 and the rearward extension 61 of the top grille 7. The crank arms 51 are affixed to the shafts 71 for rotation of the latter, as described below. The crank arms also serve to maintain the vertical positions of the shafts. The bottom ends of the shafts 71 are recessed, as shown in FIG. 6, to receive keyed shafts 57 extending from the connectors 17. Thus, rotation of the shafts 71, by means of the crank arms 51, opens and closes the connectors in a conventional fashion.

Figure 6A:
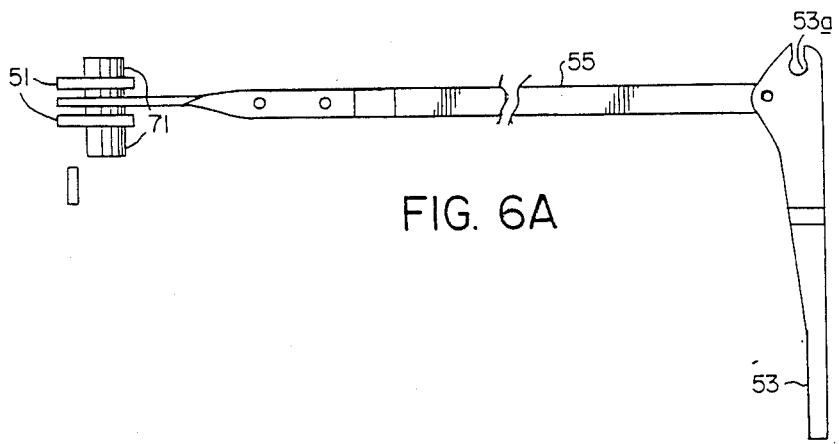
FIG. 6a is a partly exploded side view of the assembly of FIG. 6.

The crank arms 51 are rotated by means of the levers 53 at the front of the rack. Specifically, as shown in FIG. 6a, each of the levers has a pivot connection to one end of each of the flexible links 55 which, at its other end, is pivotally connected to one of the crank arms 51 (FIG. 6). The lever 53 also has an aperture 53a by which it is pivotally supported on a shaft 93 (FIGS. 1b and 2) supported in a series of projections 91 that extend upwardly from the front portion of the grille 7. The projections 91 are located so as to position each of the levers 53 in front of one of each set of the tracks 11 and 13 in which circuit boards are positionable, as shown in FIG. 1c.

Figure 1A:
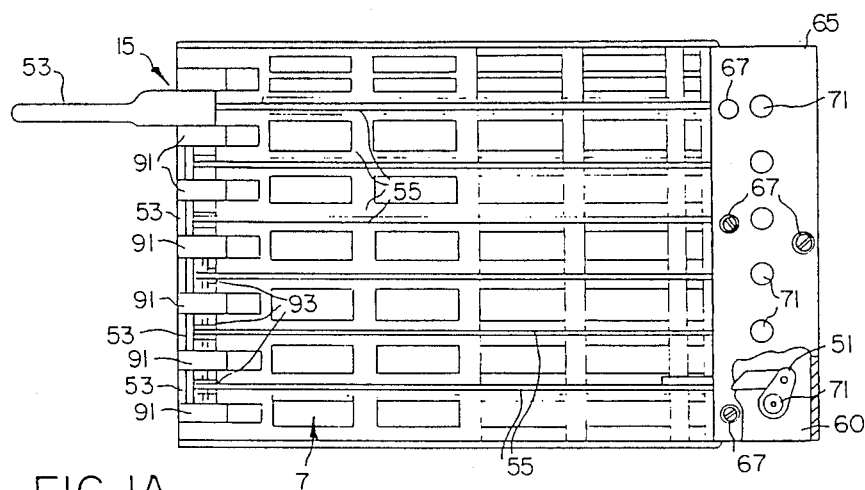
FIG. 1a is a top view of the rack of FIG. 1.

With the foregoing arrangement, when a lever 53 is rotated from the position shown in FIG. 1c to the horizontal position shown by one of the levers 53 in FIG. 1a, the link 55 connected thereto is pulled toward the front of the rack. The resulting rotation of the crank arm 51 and the shaft 71 opens the corresponding connector for insertion or removal of a circuit board. When one of the levers 53 is rotated from the horizontal to the vertical position, one of the links 55 is pushed rearward, thereby to close the connectors connected thereto, and, if a circuit board is in place in the connector to secure it in place and make electrical connections to it.

Figure 5A:
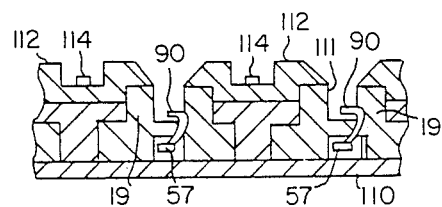
Figure 5B:
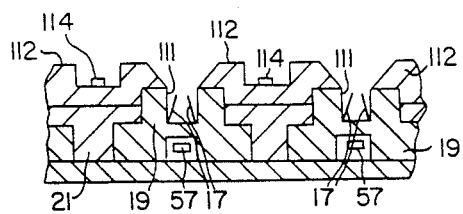
FIG. 5b is a partial sectional view of the rear panel of FIG. 5 taken along section line 5b.

With reference to FIGS. 5a and 5b, it will be recognized that means for properly positioning the modules in the rack can be provided. In this instance keying members 90 and a corresponding aperture therefor keyed in each of the circuit boards are positioned such that the keying members 90 pass through the aperture therefor when properly positioned in the slot 111. The keying members 90 are connected to the shaft 57 and are actuated by movement of the levers 53. Thus, if the module is inserted improperly into the slot 111, the keying member 90 is stopped thereby, and the connectors 17 (FIG. 5b) are prevented from contacting the board. The resilience of the links 55 prevents damage to boards and connectors when one attempts to close a connector on an improperly inserted board. As described above, closure is brought about by a rearward push of the links 55. If the connector resists closure, the force exerted by the link 55 is limited by its resilient nature, which causes an elastic buckling of the link in that situation. On the other hand, the force is not so limited during a connector-opening operation, since the link arm 55 is then under tension.

With reference to FIGS. 5, 5a and 5b, the back plate 1 is shown with a frame 110 having brackets 19 positioned thereon. The T-shaped bars 21, which are secured to the frame by suitable means, such as screws, secure the brackets 19 to the frame. The brackets 19 have U-shaped slots 111 containing the keying members 90 at their upper ends as shown in FIG. 5a. The remaining portions of the slots 111 contain the connectors 17 (FIG. 5b). Spacers 112 are secured by screws 114 to the T-shaped bars 21 approximately midway between the ends of said back plate 1. Also, half-spacers 115 (FIG. 1c) are secured to brackets 29 by rivets 116 (FIG. 1c). The spacers 112 and half-spacers 115 serve to maintain the sides of the brackets 19 in the perpendicular orientation relative to the frame 110 against the tendency of the bars 21 tends to splay the sides of the brackets 19. Further, the spacers 112 and the half-spacers 115 have tapered edges which extend upwardly and outwardly from the U-shaped slots 111, such that circuit boards which are warped but guidable in tracks 11 and 13 are guided by the spacers into the slots 111 when the boards are inserted.

Figure 5C:
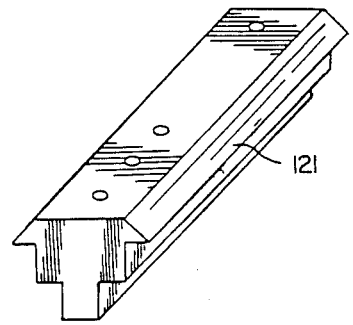
FIG. 5c is a view of an alternative component of the present invention for mounting to the frame of the rear panel of FIG. 5.

It will be further understood that the spacers 112 and the T-shaped bars 21 may be combined into a single bar 121, a shown in FIG. 5c. The bar 121 is secured by a suitable manner, such as screws, to the frame 110. Thus, it will be understood and appreciated by those skilled in the art that the present rack for housing components of electonic systems is relatively small in size, yet, it provides for ease of assembly of the rack, as well as ease of servicing of the various modules of the electronic system housed therein. The rack provides for uniform and adequate air flow for cooling of the circuit boards disposed therein, as well as parallel arrangements of the racks. The rack also provides means for remotely actuating the zero-insertion-force connectors of the rack and force limiting of such actuating means to prevent damage to the components of the rack and the circuit boards disposed therein. Further, the rack provides means for inserting warped boards into the rack.

What is claimed as new and desired to be secured by Letters Patent of the United States is:

1. In an electronic system having a means for generating a coolant flow through said system, a rack for mounting circuit boards disposed in the coolant flow generated by said means for generating, said rack comprising:

a frame having a rectangular cross-section;

two grilles supported by said frame and positioned opposite one another in the coolant flow generated by said means for generating a coolant flow;

said grilles having means for positioning a plurality of circuit boards between said grilles;

said frame having two solid side panels integral therewith;

a back plate secured to said frame and disposed at one end of each of said grilles and said side panels;

said back plate having rotary actuated zero-insertion-force connectors therein for receiving and electrically connecting said circuit boards positioned between said grilles with said system;

said grilles having apertures positioned therein to permit the passage of said coolant flow generated by said means for generating a coolant flow into one of said grilles, between circuit boards positioned in said rack, and out said other grille;

said apertures are sized and shaped to permit an essentially uniform flow of said coolant through said rack and through each of similarly sized apertures whereby said flow rate is substantially independent of the presence or absence of circuit boards in said tracks and varying features of components disposed on circuit boards positioned within said rack.

2. The rack of claim 1 further comprising means for remotely actuating said rotary actuated zero-insertion force connectors including actuator shafts connected to said zero insertion force connectors; a link member connected to said actuator shafts; and a lever member attached to said link member and rotably secured to one of said grilles opposite said back plate whereby rotation of said lever member from a first open position to a second closed position urges a board in said means for positioning said boards between said grille into position in said back plate and causes said link member to rotate said actuator shaft and thereby actuate said zero-insertion force connectors into electrical contact 3. The rack of claim 1 wherein said means for positioning said circuit bards are tracks disposed in each of said grilles, said apertures in said grilles are disposed on each side and along said tracks, said apertures have tapered edges such that the apertures that the coolant flow entering said rack from vena contracta and the apertures that the coolant flow exits from said rack form nozzles, whereby the coolant flow through the rack is substantially uniform and without appreciable turbulence.

4. The rack of claim 1 wherein said apertures in said grilles have smooth tapered portions flaring outwardly from the external surface of the grilles to the internal surface of the grilles adjacent the circuit boards, said tapered apertures on the inlet side of said rack forming a plurality of vena contracta coolant ports and the tapered apertures on the outlet side of said rack forming a plurality of nozzles through which said coolant flow exits said rack.

5. The rack of claim 2 wherein said link member is essentially a load limiting spring when in compression such that the force applied to actuate said rotary zero-insertion-force connectors is limited when said lever member is moved from said first to said second position.

6. The rack of claim 5 wherein said link member when said lever member is moved from said second to said first position is in a substantially rigid condition.

7. The rack of claim 3 wherein said apertures disposed between two of said tracks have an area and width approximately twice that of apertures disposed adjacent one of said side plates and one of said tracks and apertures of a particular size are disposed in one of said grilles opposite apertures of the same size disposed in the other of said grilles.

8. The rack of claim 7 wherein said apertures disposed between two of said tracks are approximately three eighths inches wide.

9. In an electronic system having a fan for forced air cooling of components of said system, a rack mounting circuit boards for inclusion within said electrical system, and positioned in the air stream generated by said fan, said rack comprising:
a back plate;
two parallel grilles extending perpendicular from opposite ends of said back plate;
two parallel side panels extending perpendicular from opposite sides of said back plate and between said grilles;
said grilles having tracks for guiding and positioning circuit boards in said rack in a manner parallel with said side panels;
a zero-insertion-force connection assembly secured in said back plate for electrically connecting circuit boards disposed in said tracks with said electronic system;
said zero-insertion-force connection assembly including a rotatable shaft extending from said back plate connected to the contacts of said connection assembly whereby rotation of said shaft from a first to a second position urges said contacts from an open position to a closed, active position;
a remote actuating assembly for actuating said shaft to permit the opening and closing of said contacts;
said actuating assembly including a shaft actuating unit which is connected with said shaft, said actuating unit being rotably mounted on the outer surface of one of said grilles, a link member secured at one end to said actuation unit such that linear movement of said link member causes the rotation of said shaft actuation unit, a lever member secured at the other end of said link member and movable from a first to a second position whereby movement of said lever member from said first to said second position results in urging the linear movement of said link member and the rotary movement of said actuating member to thereby rotate said shaft member, whereby the selective movement of said lever member from its first and second positions remotely opens and closes said electrical contacts of said zero-insertion-force connectors.

10. The rack of claim 9 wherein said grilles of said rack are oriented on said rack to permit passage of air from said fan to pass through said rack.

11. In an electronic system a rack for mounting circuit boards, said rack having means for guiding circuit boards in said rack, a back plate, zero-insertion-force connectors in said back plate for electrically connecting said circuit boards to said electrical system, and said connectors having a shaft extending therefrom being rotatable from a first position where said connectors are in the open condition to a second position where said connectors are urged into the closed, active position, said rack comprising:
a frame to which said back plate is secured;
said frame having a top and bottom grille in which said means for guiding said circuit boards are disposed, side panels extending between said grilles, and each of said grilles and said panels having one edge contacting said back panel;
means for remotely actuating said zero-insertion-force connectors including a shaft actuator rotably secured to one of said grilles, said shaft actuator is connected to said shaft, an elongated member secured to said shaft actuator, and means for moving said elongated member secured to said one grille opposite said back plate such that said means for moving permits the pushing and pulling of said member to cause the rotation of said shaft actuator whereby the rotation of said shaft actuator is transmitted to said shaft to thereby move said shaft between said first and second position.

12. The rack of claim 11, wherein said means for moving is a lever a rotably mounted on the upper surface of said one grille, said lever is movable from a first position away from said frame to a second position proximate to said frame and perpendicular to said one grille.

13. The rack of claim 12, wherein said means for guiding said circuit boards include tracks disposed in said grilles, said lever as it is moved from said first to second portion bears on and urges circuit boards disposed in said tracks into close proximity with said back plate and bears upon said elongated member to rotate said shaft actuator and said shaft and thus urge said connectors to said closed active condition.

14. The rack of claim 13, wherein said elongated member is a compression spring such that the force transmitted from said lever through said shaft actuator and said shaft to said electrical connectors is thereby limited.

* * * * *